(12) United States Patent
Teranishi et al.

(10) Patent No.: US 12,349,596 B2
(45) Date of Patent: Jul. 1, 2025

(54) VIBRATION DEVICE

(71) Applicant: TDK CORPORATION, Tokyo (JP)

(72) Inventors: Keisuke Teranishi, Tokyo (JP); Hiroki Mitsui, Tokyo (JP); Miho Kato, Tokyo (JP); Hideya Sakamoto, Tokyo (JP); Narumi Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 863 days.

(21) Appl. No.: 17/531,976

(22) Filed: Nov. 22, 2021

(65) Prior Publication Data

US 2022/0209096 A1 Jun. 30, 2022

(30) Foreign Application Priority Data

Dec. 25, 2020 (JP) ................. 2020-216835

(51) Int. Cl.
| | |
|---|---|
| *H01L 41/047* | (2006.01) |
| *H10N 30/20* | (2023.01) |
| *H10N 30/87* | (2023.01) |
| *H10N 30/88* | (2023.01) |

(52) U.S. Cl.
CPC ......... *H10N 30/875* (2023.02); *H10N 30/204* (2023.02); *H10N 30/88* (2023.02)

(58) Field of Classification Search
CPC ..... H10N 30/875; H10N 30/88; H10N 30/204
USPC ................................. 310/340, 344
See application file for complete search history.

(56) References Cited

U.S. PATENT DOCUMENTS

| | | | |
|---|---|---|---|
| 2015/0311423 A1* | 10/2015 | Murakami | H04R 17/00 310/366 |
| 2016/0278737 A1 | 9/2016 | Fujimura | |
| 2017/0050437 A1* | 2/2017 | Yoshiike | B41J 2/1623 |

FOREIGN PATENT DOCUMENTS

| | | |
|---|---|---|
| JP | 5905169 B1 | 4/2016 |
| JP | 2017-92167 A | 5/2017 |
| JP | 2019-102525 A | 6/2019 |
| WO | 2017/204015 A1 | 11/2017 |

\* cited by examiner

*Primary Examiner* — Derek J Rosenau
(74) *Attorney, Agent, or Firm* — Oliff PLC

(57) ABSTRACT

The vibration device includes a piezoelectric element having a connection terminal exposed from a main surface of the piezoelectric element, a first resin layer having conductivity and covering the connection terminal of the piezoelectric element to be electrically connected to the connection terminal, a wiring member overlapping the main surface of the piezoelectric element to cover the first resin layer, including a wire electrically connected to the first resin layer, and extending beyond one end of the piezoelectric element when viewed in a thickness direction of the piezoelectric element, and a second resin layer integrally covering the main surface of the piezoelectric element and the wiring member. The second resin layer includes a first layer in direct contact with the piezoelectric element and the wiring member, and a second layer covering the piezoelectric element and the wiring member via the first layer.

20 Claims, 4 Drawing Sheets

VIBRATION DEVICE

CROSS-REFERENCE TO RELATED APPLICATIONS

This application is based upon and claims the benefit of priority from Japanese Patent Application No. 2020-216835, filed on 25 Dec. 2020, the entire contents of which are incorporated herein by reference.

TECHNICAL FIELD

The present disclosure relates to a vibration device.

BACKGROUND

Known in the art is a vibration device including a piezoelectric element (for example, Japanese Patent No. 5909169).

SUMMARY

In the above-described vibration device, it is considered that unnecessary vibration is propagated to the piezoelectric element from the wiring member attached to the piezoelectric element. As a result of intensive studies, the inventors have newly found a technique capable of suppressing propagation of unnecessary vibration from the wiring member to the piezoelectric element.

According to an aspect of the present disclosure, there is provided a vibration device in which propagation of unnecessary vibration is suppressed.

A vibration device according to one aspect includes a piezoelectric element having a connection terminal exposed from a main surface of the piezoelectric element, a first resin layer having conductivity and covering the connection terminal of the piezoelectric element to be electrically connected to the connection terminal, a wiring member overlapping the main surface of the piezoelectric element to cover the first resin layer, including a wire electrically connected to the first resin layer, and extending beyond one end of the piezoelectric element when viewed in a thickness direction of the piezoelectric element, and a second resin layer integrally covering the main surface of the piezoelectric element and the wiring member from the main surface side of the piezoelectric element, wherein the second resin layer includes a first layer in direct contact with the piezoelectric element and the wiring member, and a second layer covering the piezoelectric element and the wiring member via the first layer.

In the above vibration device, the first layer of the second resin layer integrally bonds the piezoelectric element and the wiring member to promote integral bending vibration of the piezoelectric element and the wiring member, and the second layer of the second resin layer suppresses propagation of unnecessary vibration from the wiring member to the piezoelectric element.

According to another aspect of the vibration device, the second resin layer may be thinner than the wiring member.

In the vibration device according to another aspect, when the thickness of the second resin layer is t1 and the thickness of the wiring member is t2, $0.25 \leq t1/t2 < 1$ is satisfied.

In the vibration device according to another aspect, a covering area where the second resin layer covers the main surface of the piezoelectric element is larger than a covering area where the wiring member covers the main surface of the piezoelectric element.

In the vibration device according to another aspect, the second resin layer covers an entire of a portion covering the piezoelectric element of the wiring member.

The vibration device according to another aspect further includes a third resin layer provided on the main surface of the piezoelectric element and extending over an entire edge of the one end of the piezoelectric element covered with the wiring member, wherein the first resin layer is sealed by the wiring member, the second resin layer, and the third resin layer.

In the vibration device according to another aspect, the wiring member is sandwiched between the third resin layer and the second resin layer.

In the vibration device according to another aspect, the wiring member and the second layer of the second resin layer are made of the same material.

In the vibration device according to another aspect, the wiring member and the second resin layer are provided on the one end side with respect to the center of the main surface of the piezoelectric element.

DETAILED DESCRIPTION

Figure 1:
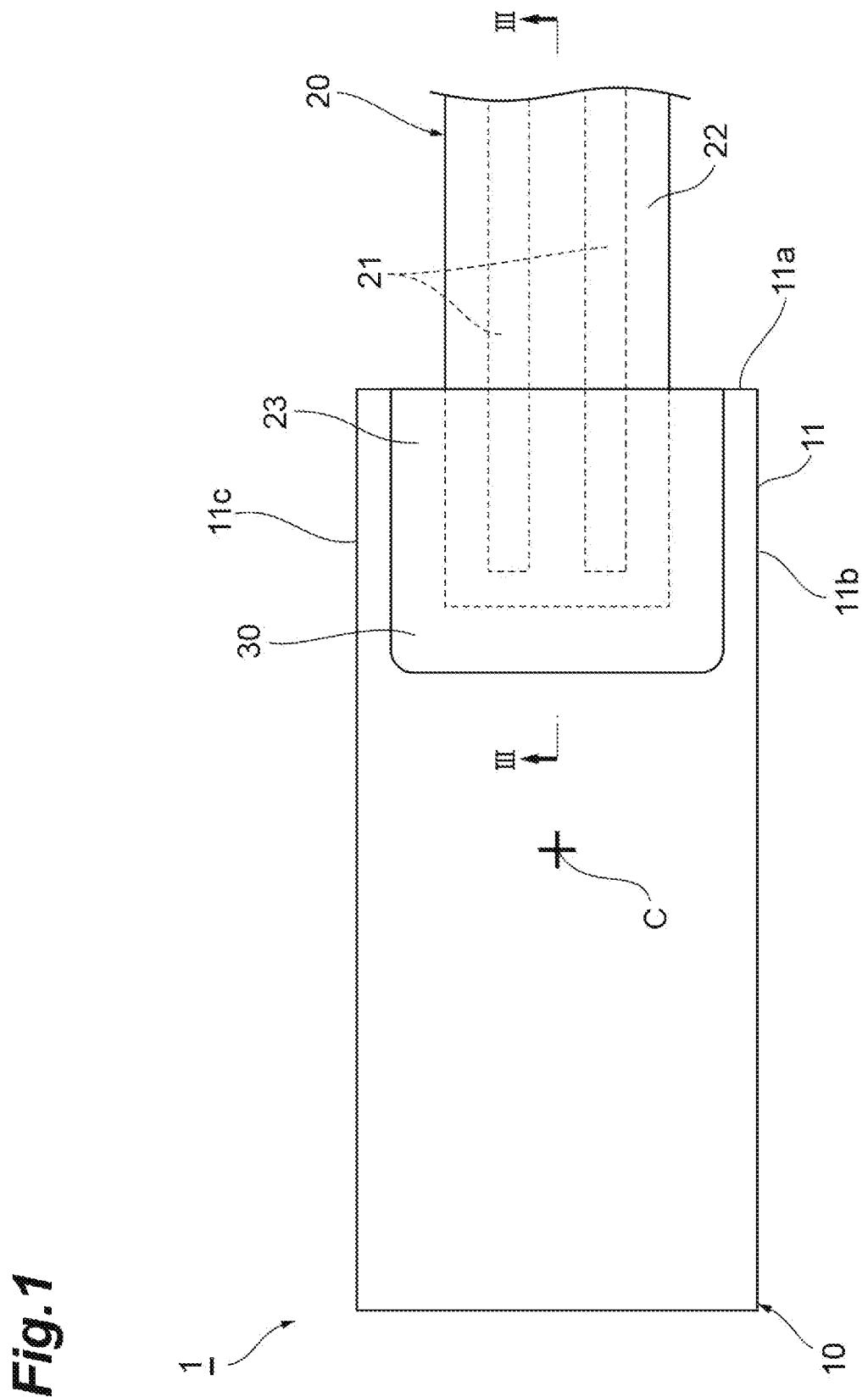
FIG. 1 is a plan view of a vibration device according to one embodiment.

Hereinafter, embodiments of the present disclosure will be described in detail with reference to the accompanying drawings. In the following description, the same element or the element having the same function is denoted by the same reference numeral, and redundant description is omitted.

Figure 2:
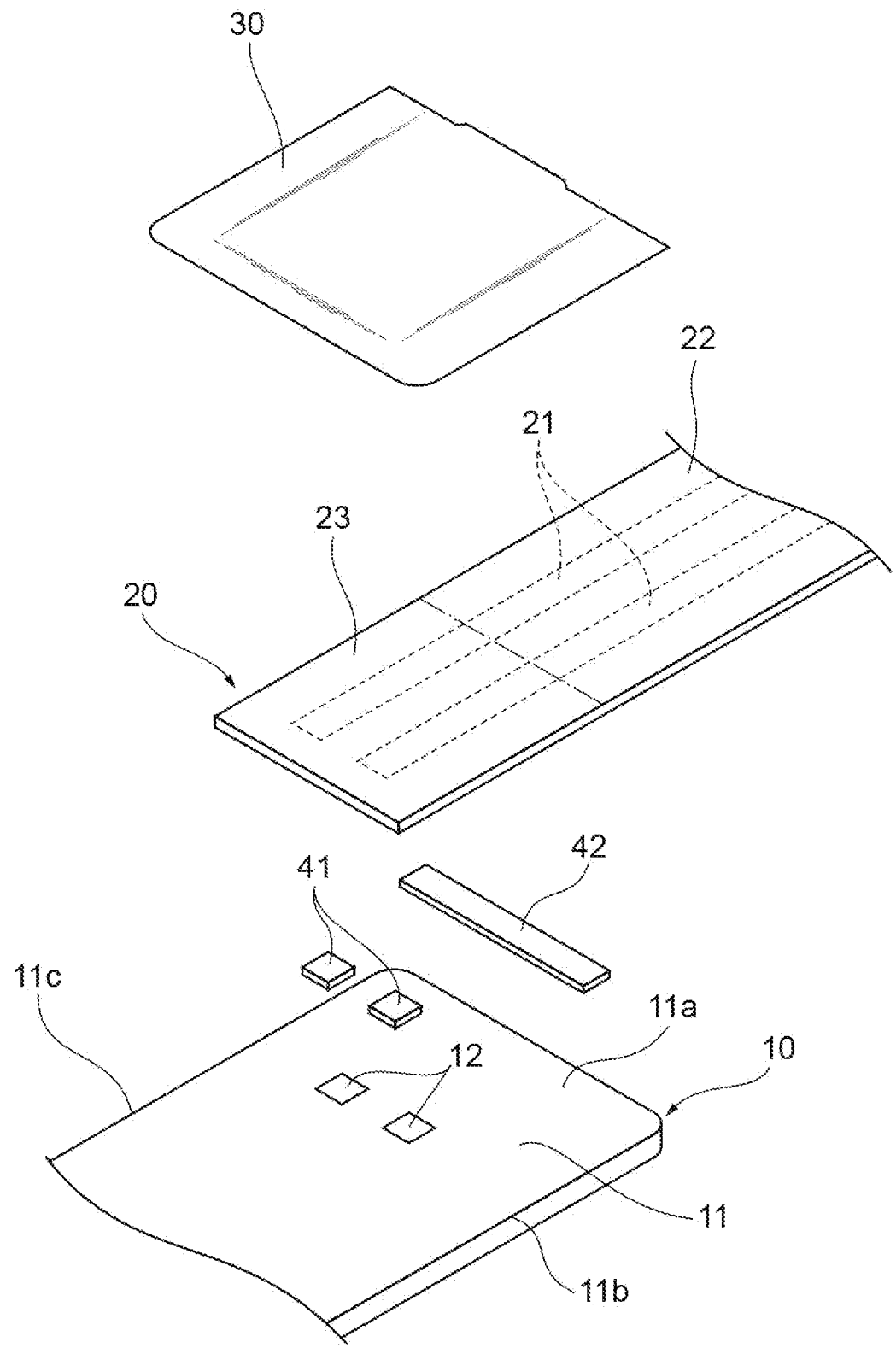
FIG. 2 is an exploded perspective view of the vibration device shown in FIG. 1.
Figure 3:
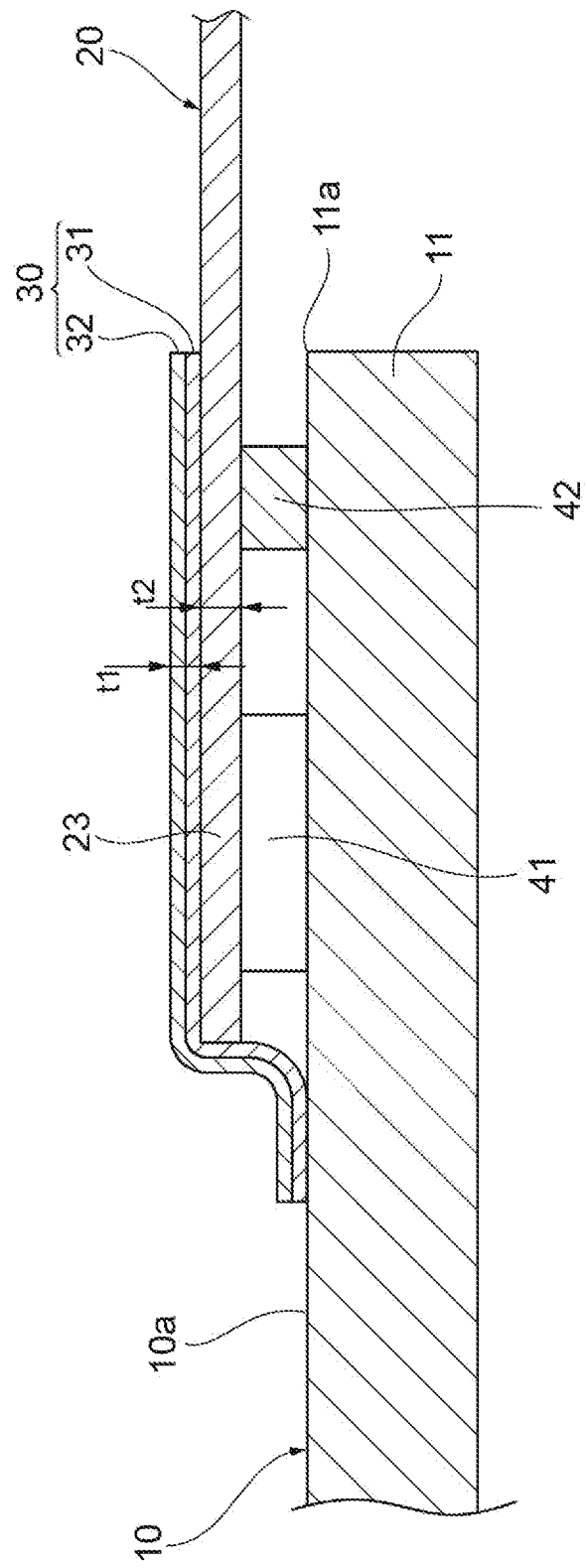
FIG. 3 is a cross-sectional view taken along line III-III of the vibration device shown in FIG. 1.

As shown in FIGS. 1 to 3, a vibration device 1 is configured to include a piezoelectric element 10, a wiring member 20, and a covering layer 30.

The piezoelectric element 10 has an outer shape of a rectangular flat plate, and includes a piezoelectric layer and electrode layers overlapping in the thickness direction. The piezoelectric element 10 includes at least a pair of electrode layers overlapping in the thickness direction and a piezoelectric layer interposed between the pair of electrode layers. The piezoelectric element 10 may have a single-layer structure including one piezoelectric layer or a multilayer structure including a plurality of piezoelectric layers and a plurality of electrode layers stacked alternately. The piezoelectric layer may be made of piezoelectric ceramic material such as PZT. The piezoelectric element 10 may have a rectangular flat plate shape with chamfered corners and ridges, or may have a rectangular flat plate shape with rounded corners and ridges. The center of the piezoelectric element 10 in plan view is shown as "C" in FIG. 1.

A pair of connection terminals 12 are exposed on an upper surface 10a (main surface) of the piezoelectric element 10. Each connection terminal 12 is electrically connected to the electrode layer constituting the piezoelectric element 10, for example, is electrically connected to each of the pair of electrode layers sandwiching the piezoelectric layer. When periodic voltage signals are input between the pair of connection terminals 12, the piezoelectric layer of the piezoelectric element 10 repeatedly expands and contracts, so that the entire piezoelectric element 10 vibrates. The piezoelectric element 10 mainly vibrates in the thickness direction.

As shown in FIG. 2, the pair of connection terminals 12 are located at one end 11 of the piezoelectric element 10. More specifically, the pair of connection terminals 12 is separated from the edge 11a of the one end 11 and is arranged along the edge 11a of the one end 11. In the present embodiment, each connection terminal 12 has a rectangular shape in the plan view. Each of the connection terminals 12 may has a circular shape or an elliptical shape in the plan view.

A pair of resin layers 41 (first resin layers) are provided on the upper surface 10a of the piezoelectric element 10 to cover the pair of connection terminals 12, respectively. Each resin layer 41 has conductivity and is made of, for example, an anisotropic conductive paste adhesive (ACP). In the plan view, the dimension of the resin layer 41 is substantially the same as the dimension of the connection terminal 12.

On the upper surface 10a of the piezoelectric element 10, a sealing resin layer 42 (third resin layer) is further provided on the one end 11 side of the pair of resin layers 41. The sealing resin layer 42 has a shape extending in one direction, for example, a rectangular shape. The sealing resin layer 42 extends along the edge 11a of the one end 11 of the piezoelectric element 10. The sealing resin layer 42 may or may not be separated from the edge 11a of the one end 11 of the piezoelectric element 10. The sealing resin layer 42 is made of nitrile rubber, for example. The sealing resin layer 42 has at least functions of adhesion and moisture resistance.

The wiring member 20 is a strip-shaped member extending in the same direction as the extending direction of the piezoelectric element 10, and is designed to be narrower than the piezoelectric element 10. As shown in FIG. 1, the wiring member 20 overlaps the piezoelectric element 10 at the end portion 23 and covers the upper surface 10a of the piezoelectric element 10. The wiring member 20 is located closer to the one end 11 than the center C with respect to the piezoelectric element 10. The one end 11 of the piezoelectric element 10 and the end portion 23 of the wiring member 20 overlap each other, and the wiring member 20 extends beyond the one end 11 of the piezoelectric element 10 when viewed from the thickness direction of the piezoelectric element 10.

The wiring member 20 includes a pair of wires 21 and a resin sheet 22 that holds the wires 21. The wiring member 20 is a flexible printed circuit substrate (FPC), for example. In the present embodiment, the wire 21 is made of Cu, and the resin sheet 22 is made of polyimide resin.

The wiring member 20 integrally covers the pair of resin layers 41 and the sealing resin layer 42 provided on the upper surface 10a of the piezoelectric element 10. The wiring member 20 is bonded to the piezoelectric element 10 by the pair of resin layers 41 and the sealing resin layer 42. Since the wiring member 20 is narrower than the piezoelectric element 10, the upper surface 10a between the wiring member 20 and each of the edges 11b and 11c of the side surfaces facing each other in the direction in which the edge 11a of the one end 11 of the piezoelectric element 10 extends is exposed. More specifically, when the wiring member 20 is attached to the one end 11 of the piezoelectric element 10, the upper surface 10a around the end portion 23 of the wiring member 20 is exposed in a U-shape as shown in FIG. 1. When covered with the wiring member 20, the sealing resin layer 42 extends over the entire region (entire edge) of the edge 11a of the one end 11 of the piezoelectric element 10.

The covering layer 30 (second resin layer) integrally covers the piezoelectric element 10 and the wiring member 20 from the upper surface 10a side of the piezoelectric element 10. The covering layer 30 also covers the U-shaped region of the upper surface 10a around the end portion 23 of the wiring member 20. The covering layer 30 covers the entire edge of the end portion 23 of the wiring member 20 covering the piezoelectric element 10 (in the present embodiment, all the edges of the three sides of the U-shape). The covering area of the covering layer 30 covering the upper surface 10a of the piezoelectric element 10 is designed to be larger than the covering area of the wiring member 20 covering the upper surface 10a of the piezoelectric element 10. Similarly to the wiring member the covering layer 30 is located closer to the one end 11 than the center C with respect to the piezoelectric element 10. The covering layer 30 has at least functions of adhesion and moisture resistance.

The covering layer 30 includes a plurality of resin layers. In the present embodiment, the covering layer 30 includes two layers, that is, a first layer 31 and a second layer 32. The first layer 31 is in direct contact with the piezoelectric element 10 and the wiring member 20. In particular, the first layer 31 integrally bonds the piezoelectric element 10 and the wiring member 20 to promote integral vibration (bending vibration) of the piezoelectric element 10 and the wiring member 20. The first layer 31 may be made of acrylic resins or silicone, for example. The second layer 32 indirectly covers the piezoelectric element 10 and the wiring member 20 via the first layer 31. The second layer 32 suppresses propagation of unnecessary vibration from the wiring member 20 to the piezoelectric element 10. The second layer 32 is made of polyimide resin, for example. That is, the second layer 32 of the covering layer 30 is made of the same material as that of the resin sheet 22 constituting the wiring member 20, in the present embodiment. The second layer 32 may be made of other resins (polyester, fluororesin, etc.) or glass cloth. The thickness t1 of the covering layer 30 is designed to be thinner than the thickness t2 of the wiring member 20. The thickness t1 of the covering layer 30 and the thickness t2 of the wiring member 20 can be designed to satisfy the relationship of $0.25 \leq t1/t2 < 1$.

As described above, the vibration device 1 includes the piezoelectric element 10 having the connection terminals 12 exposed from the upper surface 10a. The resin layers 41 have conductivity and cover the connection terminals 12 of the piezoelectric element 10 and electrically connected to the connection terminals 12, respectively. The wiring member 20 overlaps the upper surface 10a of the piezoelectric element 10, and covers the resin layers 41 and electrically connected to the resin layers 41, and extends beyond the one end 11 of the piezoelectric element 10 when viewed in the thickness direction of the piezoelectric element 10. The covering layer 30 includes the first layer 31 in direct contact with the piezoelectric element 10 and the wiring member 20, and the second layer 32 covering the piezoelectric element 10 and the wiring member 20 via the first layer 31.

In the vibration device 1, the first layer 31 of the covering layer 30 integrally bonds the piezoelectric element 10 and the wiring member 20 to promote integral vibration (bending vibration) between the piezoelectric element 10 and the wiring member 20, and the second layer 32 of the covering layer 30 suppresses propagation of unnecessary vibration from the wiring member 20 to the piezoelectric element 10.

In particular, the second layer 32 of the covering layer 30 can suppress unnecessary vibration transmitted to the piezoelectric element 10 in cooperation with the resin sheet 22 of the wiring member 20. Therefore, when the second layer 32 of the covering layer 30 is made of the same material as that of the resin sheet 22, unnecessary vibration transmitted to the piezoelectric element 10 can be effectively suppressed.

As shown in FIG. 3, in the vibration device 1, the resin layer 41 is sealed by the wiring member 20, the covering layer 30, and the sealing resin layer 42 to improve moisture resistance, and deterioration of the resin layer 41 is effectively suppressed.

In the vibration device 1, the thickness t1 of the covering layer 30 is designed to be thinner than the thickness t2 of the wiring member 20. The inventors performed the following experiment to confirm the influence of the relationship between the thickness t1 of the covering layer 30 and the thickness t2 of the wiring member 20 on the vibration device. That is, samples (Examples 1 to 3 and Comparative Examples 1 to 3) having different ratios of t1/t2 were prepared, and the total harmonic distortion (THD) was measured for each sample, and the presence or absence of peeling of the covering layer after the measurement was checked. In Examples 1 to 3, the ratios of t1/t2 were 1, 0.5, and 0.25, respectively. In addition, the total harmonic distortion of Comparative Example 1 which does not include the covering layer was measured. The ratios of t2/t 3 in Comparative Examples 1 and 2 were 1.25 and 0.2, respectively. The experimental results are shown in Table 1 below and the graph of FIG. 4.

TABLE 1

| | t1/t2 | THD [db] | Peeling |
|---|---|---|---|
| Example 1 | 1 | 8 | Absence |
| Example 2 | 0.5 | 13 | Absence |
| Example 3 | 0.25 | 19 | Absence |
| Comparative Example 1 | NA | 33 | NA |
| Comparative Example 2 | 1.25 | 25 | Presence |
| Comparative Example 3 | 0.2 | 22 | Absence |

Figure 4:
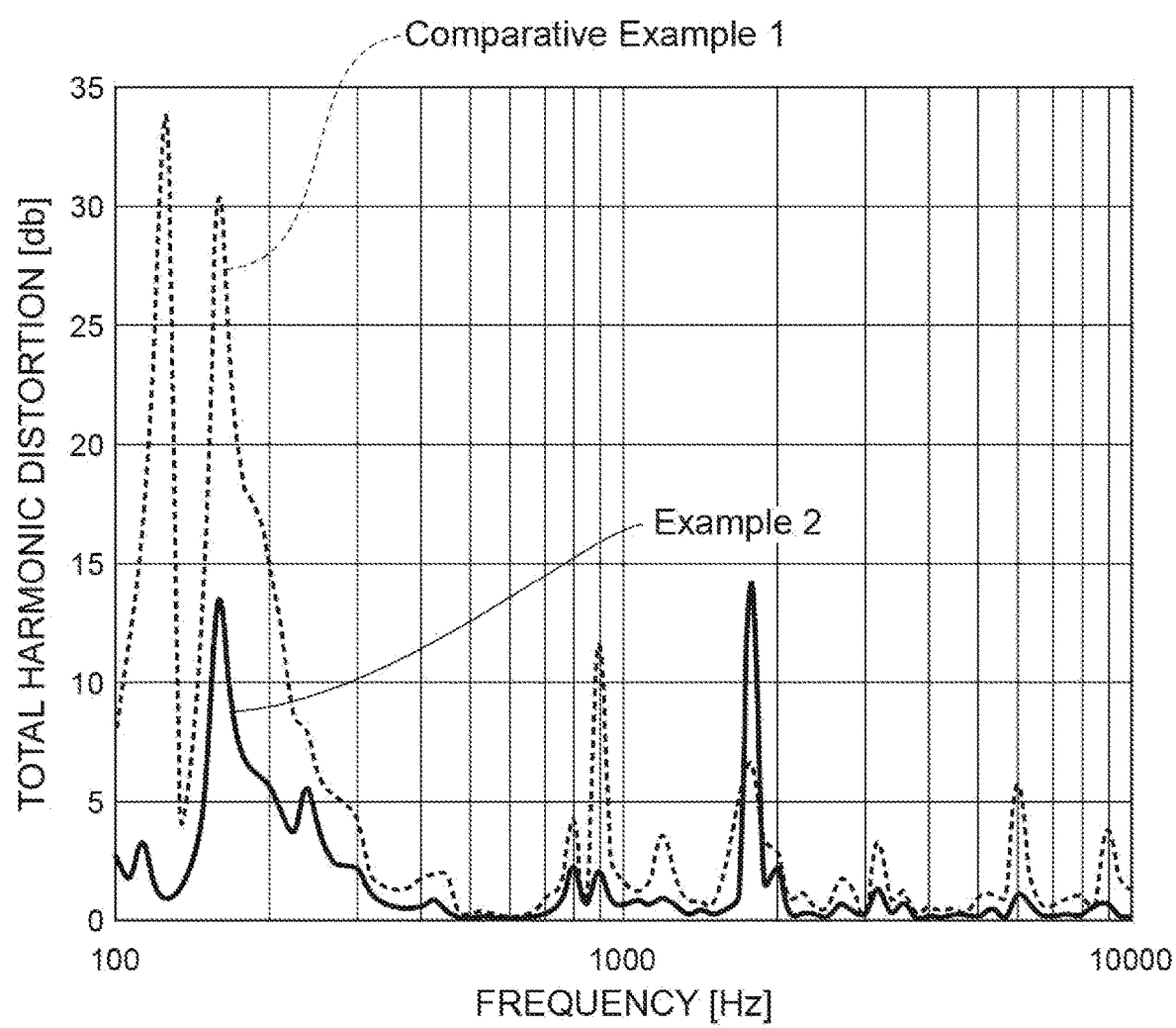
FIG. 4 is a graph showing the results of experiments conducted by the inventors.

As is clear from Table 1 and the graph of FIG. 4, in Examples 1 to 3 satisfying the relationship of 0.25≤t1/t2<1, the total harmonic distortion was suppressed to 20 db or less at 100 to 2000 Hz and good vibration characteristics (for example, sound accuracy) were obtained, and peeling of the covering layer was not confirmed. On the other hand, in all of Comparative Examples 1 to 3, the total harmonic distortion exceeded 20 db at 100 to 2000 Hz. In addition, in Comparative Example 2, peeling of the covering layer was confirmed.

Therefore, when the thickness t1 of the covering layer 30 and the thickness t2 of the wiring member 20 satisfy the relationship of 0.25≤t1/t2<1, good vibration characteristics can be obtained while suppressing peeling of the covering layer. If the thickness of the covering layer 30 is too large (for example, t1≤2), the covering layer 30 is likely to peel off, and if the thickness of the covering layer 30 is too small (for example, t1/t2<0.25), it is difficult to obtain good vibration characteristics.

What is claimed is:

1. A vibration device comprising:
a piezoelectric element having a connection terminal exposed from a main surface of the piezoelectric element;
a first resin layer having conductivity and covering the connection terminal of the piezoelectric element to be electrically connected to the connection terminal;
a wiring member overlapping the main surface of the piezoelectric element to cover the first resin layer, including a wire electrically connected to the first resin layer, and extending beyond one end of the piezoelectric element when viewed in a thickness direction of the piezoelectric element; and
a second resin layer integrally covering the main surface of the piezoelectric element and the wiring member from the main surface side of the piezoelectric element;
wherein the second resin layer includes a first layer in direct contact with the piezoelectric element and the wiring member, and a second layer covering the piezoelectric element and the wiring member via the first layer, and
wherein the second resin layer is thinner than the wiring member.

2. The vibration device according to claim 1, wherein a covering area where the second resin layer covers the main surface of the piezoelectric element is larger than a covering area where the wiring member covers the main surface of the piezoelectric element.

3. The vibration device according to claim 1, wherein the second resin layer covers an entire of a portion covering the piezoelectric element of the wiring member.

4. The vibration device according to claim 1, wherein the wiring member and the second layer of the second resin layer are made of the same material.

5. The vibration device according to claim 1, wherein the wiring member and the second resin layer are provided on the one end side with respect to the center of the main surface of the piezoelectric element.

6. A vibration device comprising:
a piezoelectric element having a connection terminal exposed from a main surface of the piezoelectric element;
a first resin layer having conductivity and covering the connection terminal of the piezoelectric element to be electrically connected to the connection terminal;
a wiring member overlapping the main surface of the piezoelectric element to cover the first resin layer, including a wire electrically connected to the first resin layer, and extending beyond one end of the piezoelectric element when viewed in a thickness direction of the piezoelectric element; and
a second resin layer integrally covering the main surface of the piezoelectric element and the wiring member from the main surface side of the piezoelectric element;
wherein the second resin layer includes a first layer in direct contact with the piezoelectric element and the wiring member, and a second layer covering the piezoelectric element and the wiring member via the first layer, and
wherein when the thickness of the second resin layer is t1 and the thickness of the wiring member is t2, 0.25≤t1/t2<1 is satisfied.

7. The vibration device according to claim 6, wherein a covering area where the second resin layer covers the main surface of the piezoelectric element is larger than a covering area where the wiring member covers the main surface of the piezoelectric element.

8. The vibration device according to claim 6, wherein the second resin layer covers an entire of a portion covering the piezoelectric element of the wiring member.

9. The vibration device according to claim 6, wherein the wiring member and the second layer of the second resin layer are made of the same material.

10. The vibration device according to claim 6, wherein the wiring member and the second resin layer are provided on the one end side with respect to the center of the main surface of the piezoelectric element.

11. A vibration device comprising:
a piezoelectric element having a connection terminal exposed from a main surface of the piezoelectric element;
a first resin layer having conductivity and covering the connection terminal of the piezoelectric element to be electrically connected to the connection terminal;
a wiring member overlapping the main surface of the piezoelectric element to cover the first resin layer, including a wire electrically connected to the first resin layer, and extending beyond one end of the piezoelectric element when viewed in a thickness direction of the piezoelectric element; and
a second resin layer integrally covering the main surface of the piezoelectric element and the wiring member from the main surface side of the piezoelectric element;
wherein the second resin layer includes a first layer in direct contact with the piezoelectric element and the wiring member, and a second layer covering the piezoelectric element and the wiring member via the first layer,
the vibration device further comprises a third resin layer provided on the main surface of the piezoelectric element and extending over an entire edge of the one end of the piezoelectric element covered with the wiring member, and
wherein the first resin layer is sealed by the wiring member, the second resin layer, and the third resin layer.

12. The vibration device according to claim 11, wherein a covering area where the second resin layer covers the main surface of the piezoelectric element is larger than a covering area where the wiring member covers the main surface of the piezoelectric element.

13. The vibration device according to claim 11, wherein the second resin layer covers an entire of a portion covering the piezoelectric element of the wiring member.

14. The vibration device according to claim 11, wherein the wiring member and the second layer of the second resin layer are made of the same material.

15. The vibration device according to claim 11, wherein the wiring member and the second resin layer are provided on the one end side with respect to the center of the main surface of the piezoelectric element.

16. A vibration device comprising:
a piezoelectric element having a connection terminal exposed from a main surface of the piezoelectric element;
a first resin layer having conductivity and covering the connection terminal of the piezoelectric element to be electrically connected to the connection terminal;
a wiring member overlapping the main surface of the piezoelectric element to cover the first resin layer, including a wire electrically connected to the first resin layer, and extending beyond one end of the piezoelectric element when viewed in a thickness direction of the piezoelectric element; and
a second resin layer integrally covering the main surface of the piezoelectric element and the wiring member from the main surface side of the piezoelectric element;
wherein the second resin layer includes a first layer in direct contact with the piezoelectric element and the wiring member, and a second layer covering the piezoelectric element and the wiring member via the first layer, and
wherein the wiring member is sandwiched between the third resin layer and the second resin layer.

17. The vibration device according to claim 16, wherein a covering area where the second resin layer covers the main surface of the piezoelectric element is larger than a covering area where the wiring member covers the main surface of the piezoelectric element.

18. The vibration device according to claim 16, wherein the second resin layer covers an entire of a portion covering the piezoelectric element of the wiring member.

19. The vibration device according to claim 16, wherein the wiring member and the second layer of the second resin layer are made of the same material.

20. The vibration device according to claim 16, wherein the wiring member and the second resin layer are provided on the one end side with respect to the center of the main surface of the piezoelectric element.

* * * * *